United States Patent [19]
Okutani

[11] Patent Number: 5,126,736
[45] Date of Patent: Jun. 30, 1992

[54] POSITION DETECTION ENCODER HAVING PLURAL LIGHT RECEIVING AND LIGHT EMITTING ELEMENTS

[75] Inventor: Norio Okutani, Neyagawa, Japan

[73] Assignee: Matsushita Electric Industrial Co., Ltd., Kadoma, Japan

[21] Appl. No.: 602,095

[22] Filed: Oct. 25, 1990

[30] Foreign Application Priority Data

Oct. 25, 1989 [JP] Japan ................. 1-279344

[51] Int. Cl.⁵ .................................. H03M 1/30
[52] U.S. Cl. .......................... 341/13; 250/231.18
[58] Field of Search ............ 341/13, 11, 14, 6, 9; 250/231.18, 231.14, 231.16

[56] References Cited

U.S. PATENT DOCUMENTS

| | | | |
|---|---|---|---|
| 4,580,047 | 4/1986 | Sasaki et al. | 250/231 SE |
| 4,680,466 | 7/1987 | Kuwahara et al. | 250/231 SE |
| 4,990,932 | 2/1991 | Houston | 346/45 |
| 5,021,781 | 6/1991 | Salazar et al. | 341/13 |

Primary Examiner—A. D. Pellinen
Assistant Examiner—Brian K. Young
Attorney, Agent, or Firm—Wenderoth, Lind & Ponack

[57] ABSTRACT

A position detection encoder includes a code plate having a plurality of slots formed therein, a first light emitting element and a first light receiving element disposed on one side of the code plate, and a second light emitting element and a second light receiving element disposed on another side of the code plate. A first light beam emitted from the first light emitting element and received by the second light receiving element passes simultaneously through a same one of the plurality of slots of the code plate as does a second light beam emitted from the second light emitting element and received by the first light emitting element. Detection signals having differing phases are respectively obtained from the first and second light receiving elements.

4 Claims, 3 Drawing Sheets

POSITION DETECTION ENCODER HAVING PLURAL LIGHT RECEIVING AND LIGHT EMITTING ELEMENTS

BACKGROUND OF THE INVENTION

The present invention generally relates to an encoder, and more particularly, to an encoder having a plurality of light emitting elements and light receiving elements.

Generally an incremental type encoder is known which is provided with a code plate having a line of slits (i.e. light apertures.) formed regularly therein along a movement direction, and with a plurality of pairs of light emitting elements and light receiving elements disposed along the direction of the slits on both sides of the code plate, so that detection signals having different phases may be obtained from the respective light receiving elements with the by arranging the positions thereof so that the phases become mutually different with respect to the slits.

Also, an absolute type of encoder is also known which includes coded patterns, such as binary coded patterns or the like, formed of a plurality of lines of slits on a code plate, and also, a light emitting element and a light receiving element disposed oppositely to each other on both the sides of the code plate in accordance with the respective coded patterns.

Further, there is disclosed in Japanese Laid-Open Patent Application Tokukaisho No. 61-189415, an encoder of high resolution including the incremental type encoder and the absolute type encoder using code plate 21 having slits 22 and a plurality coded slit patterns 23 formed thereon as shown in FIG. 3.

In the above described incremental type encoder, as shown in FIG. 4, a plurality of light emitting elements 33 are disposed at proper intervals in the direction of the slits on one side of the code plate 31 with many slits 32 being formed therein. A mask 34 with openings 35 formed therein is disposed on the other side of the code plate 31 so as to approximately oppose the respective light emitting elements 33 and to become different in phase to each other with respect to the slits 32, and also, the light receiving element 36 is disposed opposite to the respective openings 35.

In the encoder of the above described absolute type encoder, as shown in FIG. 5, a plurality of light emitting elements 43 are disposed in parallel in accordance with the coded slit patterns 42a, 42b, 42c one side of the code plate 41. A mask 44 with openings 45 corresponding to respectively coded patterns formed therein is disposed on the other side of the code plate 41, and also, a light receiving element 46 is disposed opposite to the each opening 45.

In the incremental type encoder of the above described construction, there are intervals between a pair of light emitting elements 33, 33 and between the light receiving elements 36, 36. As the transmission lights of the slits 32 of the different positions of the code plate 31 are used, error factors such as eccentricity, inclination, working error and so on of the code plate 31 are separately received, with a problem resulting in that stable detection signals are difficult to obtain.

In the absolute type encoder of the above described construction, the intervals of the respective coded patterns 42a, 42b, 42c are required to be made larger, so that crosstalk is not caused with respect to the other light receiving elements 46 through the incidence of the lights which have transmitted through the corresponding coded patterns 42a, 42b, 42c from the respective light emitting element 43 and the openings 45 of the mask 44 only upon the respectively corresponding light receiving element 46 as shown in the break line in FIG. 5. 5, with a problem resulting in that the size of the encoder cannot be made smaller.

SUMMARY OF THE INVENTION

Accordingly, the present invention has been developed with a view to substantially eliminating the above discussed drawbacks inherent in the prior art, and has for its essential object to provide an improved encoder.

Another important object of the present invention is to provide a improved encoder of the type referred to above, where a plurality of light emitting elements and light receiving elements are provided, stable detection signals are provided if the error factors are provided on the code plate when the detection signals having the phase difference are obtained, also, the size may be made smaller when the coded patterns are used.

In accomplishing these and other objects, according to a first embodiment of the present invention, there is provided an encoder including a light emitting element, a code plate with slits formed therein, a light receiving element a plurality of signals having a phase difference may be provided by a plurality of light emitting elements and light receiving elements a pair of light emitting elements are disposed approximately oppositely to each other on both the sides of the code plate, a pair of light receiving elements corresponding to these light emitting elements are respectively arranged on the opposite sides of the code plate and in approximate opposition to each other so that a pair of detection signals having the phase difference may be obtained with the lights passing through the same slit.

Also, according to a second embodiment of the present invention, there is provided an encoder including with a code plate having coded patterns formed of a plurality of slits thereon, and a plurality of light emitting elements and light receiving elements disposed opposite to each other on both the sides of the code plate in accordance with the respective coded patterns. The light emitting element and the light receiving element are disposed alternately on both the sides of the code plate, and the light emitting element and the light receiving element are disposed oppositely to each other with a code plate being grasped therebetween.

According to the first embodiment of the present invention, the lights coming from a pair of light emitting elements respectively transmit through the slit in the same position of the code plate, and become incident to the pair of corresponding light receiving elements, and a pair of detection signals having a phase difference may be obtained, so that the same error factors are received if the error factors are provided on the code plate, and stable detection signals may be obtained. Also, as the light emitting element and the light receiving elements are disposed respectively on both the sides of the code plate, crosstalk is not caused through the incidence of the light except for the light of the corresponding light emitting element onto the light receiving element.

Also, according to the second embodiment, since the light emitting element and the light receiving element are alternately disposed on both the sides of the code plate, the light emitting element and the light receiving element have only to be disposed with respect to the light receiving element, so that the lights from the light emitting element except for one light receiving element adjacent to the light emitting element disposed corresponding to it may not become incident, crosstalk is not caused even if a plurality of light emitting elements and the light receiving elements are disposed at a small interval, the pitch arrangement of the coded patterns may be made smaller, and the size of the encoder may be made smaller.

BRIEF DESCRIPTION OF THE DRAWINGS

These and other objects and features of the present invention will become apparent from the following description taken in conjunction with the preferred embodiment thereof with reference to the accompanying drawings, in which.

DETAILED DESCRIPTION OF THE INVENTION

Figure 1:
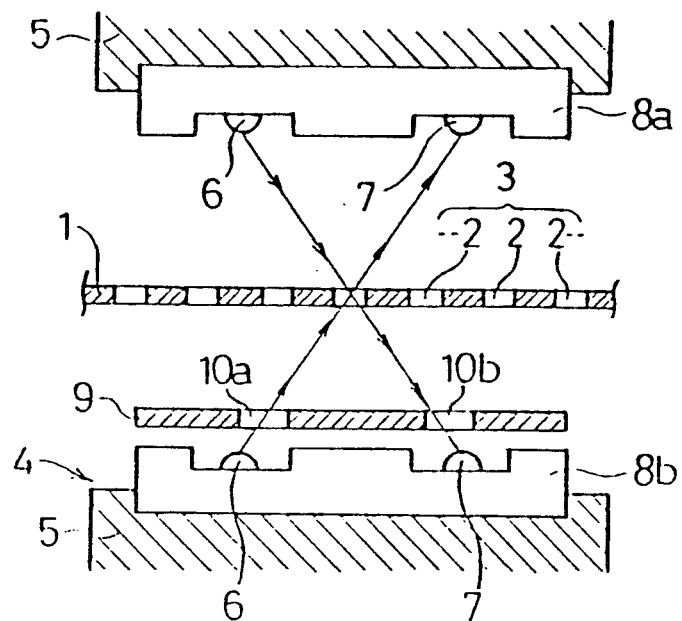
FIG. 1 is a partial sectional front face view showing a schematic construction of the essential portions of an encoder in a first embodiment of the present invention.

Before the description of the present invention proceeds, it is to be noted that like parts are designated by like reference numerals throughout the accompanying drawings.

Referring now to the drawings, there is shown in FIG. 1 an encoder according to the first embodiment of the present invention, which includes a code plate 1 which moves together with a rotary member or a moving member the code plate 1 includes a line 3 having many slits 2 arranged regularly along the moving direction thereof. A detector 4 detects the position of the code plate 1, with the main body thereof being formed on both sides of plate 1 detection blocks 8a, 8b are each provided with a light emitting element 6 and a light receiving element 7 and are being mounted on opposite faces with respect to the code plate 1. The light emitting elements 6 of the respective detection blocks 8a, 8b are disposed approximately oppositely to each other on both the sides of the code plate 1. The light emitting element 7 of the detection blocks 8b, 8a on the opposite sides to which the lights coming from these light emitting elements 6 become incident is also disposed approximately oppositely to each other on both sides of the code plate 1. The lights coming from the light emitting elements 6 of the respective detection blocks 8a, 8b are adapted to pass through the same slits 2 of the code plate 1, and become incident to the respective light receiving elements 7 of the detection blocks 8b, 8a on the opposite side.

Also, a mask 9 with an opening 10a for regulating the flux of the lights which are projected towards the code plate 1 from the light emitting element 6, and an opening 10b for regulating the flux of the lights which become incident to the light receiving element 7 thereof is disposed between one detection block 8b and the code plate 1. The openings 10a, 10b are constructed so that the amount of the lights which pass through the slits 2 and become incident to a pair of light receiving elements 7 may have a phase difference of 90°. Although the detection signal having the phase difference may be obtained by the adjustment of the arrangement positions of the light emitting element 6 and the light receiving element 7 without the provision of the mask 9, detection with better accuracy may be effected if the mask 9 is provided.

According to the above described construction, the lights coming from the light emitting elements 6 of a pair of detection blocks 8a, 8b respectively pass through the slits 2 at the same position of the code plate 1, become incident to the light receiving element 7 of the detection blocks 8b, 8a on the opposite side, so that a pair of detection signals having a phase difference of 90° may be obtained. Accordingly since the detection signal from the light receiving element 7 receives the same error factor if the code plate 1 is provided with the error factor, stable detection signals may be provided. The lights coming from the light emitting elements 6 of the respective detection blocks 8a, 8b is not incident to the light receiving element 7 of the same detection blocks 8a, 8b, with no possibility that crosstalk is caused.

Figure 2:
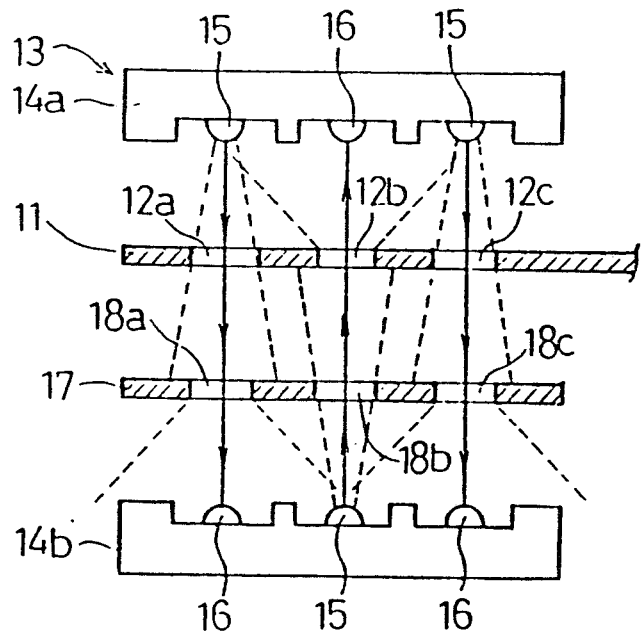
FIG. 2 is a partial sectional side face view showing a schematic construction of the essential portions of an encoder in a second embodiment of the present invention.

According to the second embodiment of FIG. 2, a code plate 11 moves together with a rotary member or moving member, and includes a plurality of binary coded patterns 12a, 12b, 12c arranged in parallel in a direction orthogonal to the moving direction. A detector 13 detects the absolute position of the code plate 11 in accordance with the binary coded pattern, and is composed of a pair of detection blocks 14a, 14b disposed on both the sides with the code plate 11 therebetween. The light emitting element 15 and the light receiving element 16 are provided on detection blocks 14a, 14b, so that they may be correspondingly provided with respect to the binary coded patterns 12a, 12b, 12c, and be mutually provided oppositely, and the light emitting element 15 and the light receiving element 16 are alternately disposed respectively in the respective detection blocks 14a, 14b.

Also, a mask 17 which has openings 18a, 18b, 18c formed corresponding to the respective binary coded patterns 12a, 12b, 12c is arranged between one detection block 14b and the code plate 11.

According to the above described construction, the lights coming from the light emitting element 15 of the respective detection heads 14a, 14b pass through the code plate 11 and the mask 17, become incident to the light receiving element 16 as shown the dashed lines in FIG. 2. At this time, in the detection blocks 14a, 14b arranged on both the sides of the code plate 11, the light emitting element 15 and the light receiving element are respectively arranged alternately. Therefore, the lights from the light emitting element 15 adjacent in one light receiving element 16 to the light emitting element arranged oppositely arranged to it have only not to become incident with respect to one light receiving element 16. In the respectively detection blocks 14a, 14b, the crosstalk is not caused even if the light emitting element 15 and the light receiving element 16 are arranged at a small interval. The arrangement pitch of the binary coded patterns 12a, 12b, 12c and the light emitting element 15, the light receiving light element 16 may be made small, so that the encoder may be made smaller.

Figure 3:
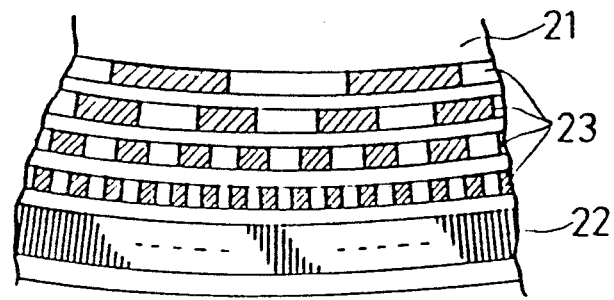
FIG. 3 is a plan view showing one example of a code plate of a conventional encoder.
Figure 4:
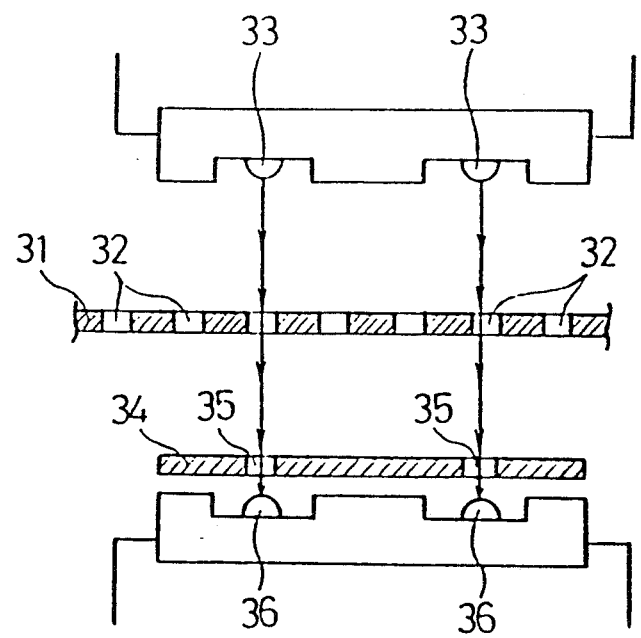
FIG. 4 is a partial sectional front face view showing a schematic construction of the essential portions of an encoder of the first conventional example.
Figure 5:
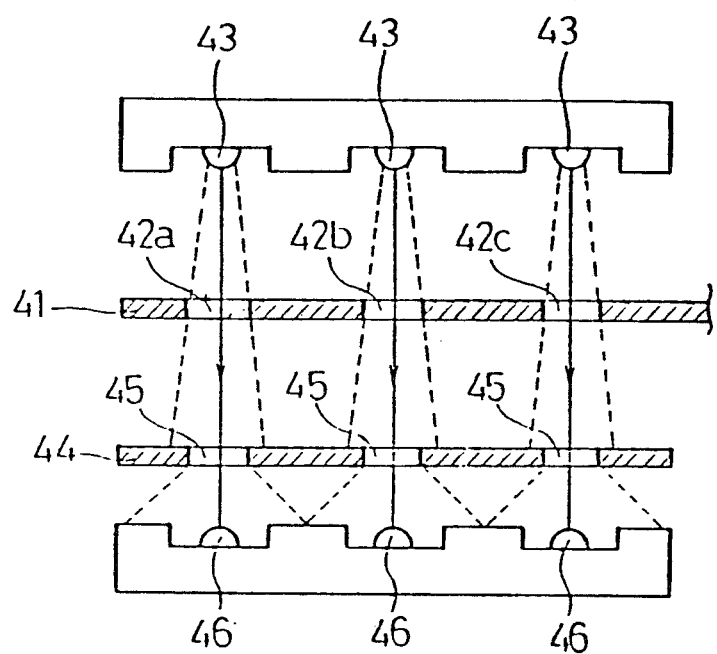
FIG. 5 is a partial sectional side face view showing the schematic construction of the essential potions of the second conventional example.

Although in the above described embodiments, an increment encoder for position detecting using the slit line 3, and an absolute encoder for position detecting using the binary coded patterns 12a, 12b, 12c are shown by way of example, the above described embodiments may be combined by the use of a code plate having the slit lines and the binary coded patterns combined as shown in FIG. 3. Thus, an absolute type encoder of high resolution which is capable of stable detection signals and is compact in construction may be provided.

As is clear from the foregoing description, according to a first embodiment of the present invention, the lights coming from a pair of light emitting elements are respectively transmitted through the slit in the same position of the code plate, become incident to a pair of corresponding light receiving elements, a pair of detection signals having a phase difference may be obtained, so that the detection signals receive the same error factor even if the error factor is in the code plate, with an effect that the stable detections signals may be provided.

Also, according to a second embodiment thereof, as the light emitting element and the light receiving element are alternately disposed on both the sides of the code plate, crosstalk is not caused if a plurality of light emitting elements and light receiving element are arranged at small intervals, the arrangement pitch of the coded patterns may be made smaller, and the size of the encoder may be made smaller in size.

Although the present invention has been fully described by way of example with reference to the accompanying drawings, it is to be noted here that various changes and modification will be apparent to those skilled in the art. Therefore, unless otherwise such changes and modification depart from the scope of the present invention, they should be construed as included therein.

What is claimed is:

1. An encoder apparatus comprising:
    a code plate having a plurality of slits formed therein;
    a first light emitting element for emitting a first light beam and a first light receiving element for receiving a second light beam each disposed on one side of said code plate;
    a second light emitting element for emitting the second light beam and a second light receiving element for receiving the first light beam each disposed on another side of said code plate;
    wherein the first light beam emitted form said first light emitting element and received by said second light receiving element passes simultaneously through a same one of said plurality of slits of said code plate as the second light beam emitted from said second light emitting element and received by said first light receiving element.

2. An encoder apparatus as recited in claim 1, wherein said first light emitting element is located opposite to said second light emitting element relative to said code plate, and wherein said first light receiving element is located opposite to said second light receiving element relative to said code plate.

3. An encoder apparatus as recited in claim 1, further comprising a mask element disposed between said code plate and said first light emitting element and said first light receiving element, said mask element having first and second light openings therein respectively located in accordance with a travel path of the first light beam and the second light beam.

4. An encoder apparatus as recited in claim 2, further comprising a mask element disposed between said code plate and said first light emitting element and said first light receiving element, said mask element having first and second light openings therein respectively located in accordance with a travel path of the first light beam and the second beam.

* * * * *